United States Patent
Sun et al.

(10) Patent No.: US 10,431,432 B2
(45) Date of Patent: Oct. 1, 2019

(54) PLASMA TREATMENT SYSTEM INCLUDING COVER PLATE TO INSULATE WINDOW

(71) Applicant: Samsung Electronics Co., Ltd., Suwon-si, Gyeonggi-do (KR)

(72) Inventors: Jongwoo Sun, Seoul (KR); Hakyoung Kim, Bucheon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 626 days.

(21) Appl. No.: 15/180,877

(22) Filed: Jun. 13, 2016

(65) Prior Publication Data

US 2017/0047235 A1  Feb. 16, 2017

(30) Foreign Application Priority Data

Aug. 10, 2015 (KR) .................. 10-2015-0112533

(51) Int. Cl.
*H01J 37/32* (2006.01)
*H01L 21/3065* (2006.01)

(52) U.S. Cl.
CPC ...... *H01J 37/32532* (2013.01); *H01J 37/321* (2013.01); *H01J 37/3244* (2013.01); *H01J 37/32082* (2013.01); *H01J 37/32119* (2013.01); *H01L 21/3065* (2013.01)

(58) Field of Classification Search
CPC ......... C30B 33/00; C30B 33/08; C30B 33/12; C30B 35/00; C30B 35/007; C23C 16/00; C23C 16/02; C23C 16/0227; C23C 16/0245; H01J 37/32; H01J 37/32009; H01J 37/32018; H01J 37/32082; H01J 37/321; H01J 37/32119; H01J 37/3211; H01J 37/32431; H01J 37/3244; H01J 37/32458; H01J 37/32477; H01J 37/32513; H01J 37/32522; H01J 37/32532; H01L 21/3065

USPC .............. 117/84, 88, 94, 97, 106, 200, 204; 118/715, 722, 723 R, 723 E, 723 I; 156/345.1, 345.33, 345.48

See application file for complete search history.

(56) References Cited

U.S. PATENT DOCUMENTS

| | | | |
|---|---|---|---|
| 5,922,223 A | 7/1999 | Okumura et al. | |
| 6,177,646 B1 * | 1/2001 | Okumura | H01J 37/321 156/345.37 |
| 6,387,208 B2 | 5/2002 | Satoyoshi et al. | |
| 2007/0004208 A1 | 1/2007 | Ohkuni | |
| 2008/0295872 A1 * | 12/2008 | Riker | H01J 37/32357 134/105 |
| 2011/0115380 A1 * | 5/2011 | Ebe | H01J 37/32091 315/111.41 |
| 2012/0031562 A1 | 2/2012 | Setsuhara et al. | |

(Continued)

FOREIGN PATENT DOCUMENTS

| | | |
|---|---|---|
| JP | 09237776 | 9/1997 |
| JP | 2003309109 | 10/2003 |
| JP | 2011124362 | 6/2011 |

*Primary Examiner* — Kenneth A Bratland, Jr.
(74) *Attorney, Agent, or Firm* — Sughrue Mion, PLLC (57) ABSTRACT

A cover plate, a plasma treatment system, and a plasma treatment method therewith are disclosed. The plasma treatment system may include a window, an antenna electrode disposed on the window, and a cover plate disposed between the antenna electrode and the window to cover top and side surfaces of the window.

19 Claims, 8 Drawing Sheets

(56) References Cited

U.S. PATENT DOCUMENTS

2012/0291955 A1 11/2012 Cho et al.
2013/0292055 A1* 11/2013 Setton ............... H01J 37/32119
156/345.1

* cited by examiner

PLASMA TREATMENT SYSTEM INCLUDING COVER PLATE TO INSULATE WINDOW

CROSS-REFERENCE TO RELATED APPLICATIONS

This U.S. non-provisional patent application claims priority under 35 U.S.C. § 119 to Korean Patent Application No. 10-2015-0112533, filed on Aug. 10, 2015, in the Korean Intellectual Property Office, the entire contents of which are hereby incorporated by reference.

BACKGROUND OF THE INVENTION

Example embodiments of the inventive concept relate to a system of fabricating a semiconductor device, and in particular, to a cover plate and a plasma treatment system including the same.

In general, semiconductor devices are manufactured using a plurality of unit processes, such as a thin-film deposition process, a diffusion process, a thermal treatment process, a photolithography process, a polishing process, an etching process, an ion implantation process, and a cleaning process. Here, the etching process is classified into two processes of dry and wet etching processes. The dry etching process is generally performed using a plasma reaction. During the plasma reaction, a substrate is heated to a high temperature. In a conventional plasma treatment system, an aging process may be performed after an idle time. For example, the aging process may be performed to preliminarily heat a plasma treatment system to the high temperature for the plasma reaction, and this may make it possible to compensate for the heat loss of the plasma treatment system.

SUMMARY

Example embodiments of the inventive concept provide a plasma treatment system allowing an etching process to be performed without an aging process.

Example embodiments of the inventive concept provide a cover plate, which is configured to reduce heat loss in a plasma reaction, and a plasma treatment system including the same.

According to example embodiments of the inventive concept, the plasma treatment system may include a window, an antenna electrode disposed on the window, and a cover plate disposed between the antenna electrode and the window, the cover plate extending to a side surface of the window to cover a top surface and the side surface of the window.

According to example embodiments of the inventive concept, the plasma treatment system may include a chamber including a lower housing and an upper housing on the lower housing, a window disposed in the upper housing, an antenna electrode disposed in the upper housing and on the window, and a cover plate disposed between the antenna electrode and the window, the cover plate extending to a side surface of the window to cover a top surface and the side surface of the window.

According to example embodiments of the inventive concept, the cover plate may include a disk portion disposed on a target object to have an opening exposing a portion of the target object and a lower edge end portion disposed below an edge of the disk portion to enclose a sidewall of the target object. The opening may include a circular hole disposed at a center region of the disk portion, and a linear hole extending from the circular hole to an outer peripheral surface of the disk portion.

According to example embodiments of the inventive concept, the plasma treatment system may include a window, an antenna electrode disposed on the window, and a cover plate including a disk portion disposed between the antenna electrode and the window. The disk portion may include a circular hole formed in the antenna electrode and a linear hole extending from the circular hole to an outer peripheral surface of the disk portion.

According to example embodiments of the inventive concept, a plasma treatment method may include performing an unit process in a plasma treatment system having a first temperature higher than a second temperature, stopping temporarily the unit process to cool the plasma treatment system to the second temperature, and performing again the unit process without an aging process of the plasma treatment system to heat the plasma treatment system from the second temperature to the first temperature. The plasma treatment system may include a chamber including a lower housing and a upper housing on the lower housing, a window disposed in the upper housing, an antenna electrode disposed on the window, and a cover plate disposed between the antenna electrode and the window. The cover plate may extend to a side surface of the window to cover a top surface and the side surface of the window.

Example embodiments of the inventive concept may also provide semiconductor fabrication systems including a plasma treatment system allowing an etching process to be performed without an acting process, and semiconductor fabrication systems including a plasma treatment system including a cover plate, which is configured to reduce heat loss in a plasma reaction.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein, rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1:
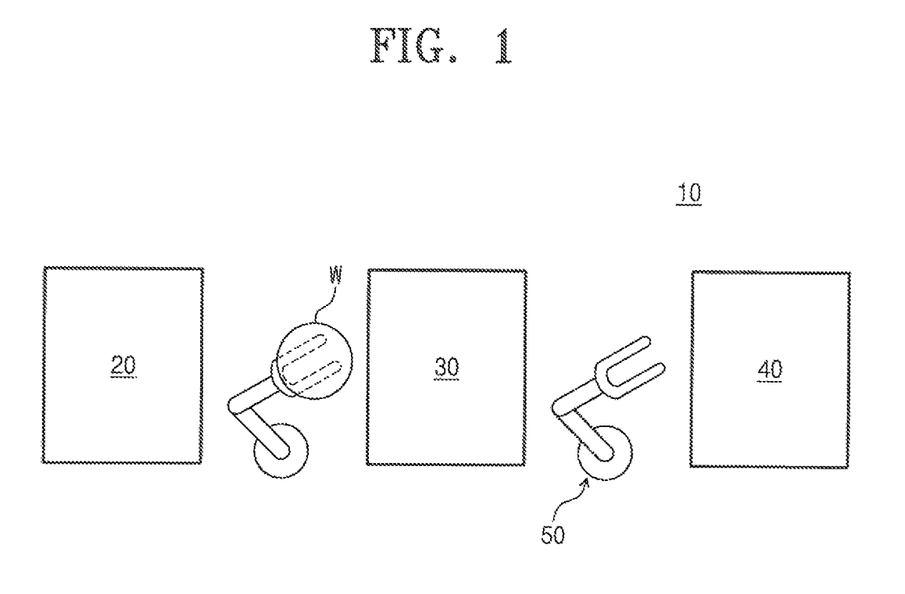
FIG. 1 is a schematic diagram illustrating a semiconductor fabrication system, according to example embodiments of the inventive concept.

FIG. 1 is a schematic diagram exemplarily illustrating a system of fabricating a semiconductor device, according to example embodiments of the inventive concept.

Referring to FIG. 1, a semiconductor fabrication system 10 may be configured to perform at least one unit process on a substrate W. For example the unit process may be one of a deposition process, a lithography process, and an etching process. Alternatively, the unit process may be one of a diffusion process a thermal treatment process, a polishing process, an ion implantation process, a cleaning process, and an ashing process. In some embodiments, the semiconductor fabrication system 10 may include a deposition system 20, a photolithography system 30, an etching system 40, and transferring devices 50. The deposition system 20 may be configured to perform a deposition process. For example, the deposition system 20 may be used to deposit a thin layer on the substrate W. The substrate W may be or include a semiconductor wafer. Alternatively, the substrate W may be or include a transparent (e.g., glass or plastic) substrate. The photolithography system 30 may be configured to perform a lithography process on a photoresist layer. For example, the photolithography system 30 may be used to form a mask pattern on the substrate W. The etching system 40 may be configured to perform an etching process. For example, the etching system 40 may be used to etch the substrate W and/or the thin layer exposed by a mask pattern. Each of the transferring devices 50 may be configured to transfer the substrate W. For example, each of the transferring devices 50 may be disposed between the deposition system 20 and the photolithography system 30 or between the photolithography system 30 and the etching system 40. In some embodiments, the deposition system 20, the photolithography system 30, the etching system 40, and the transferring devices 50 may be arranged in a line. The semiconductor fabrication system 10 may be configured to sequentially perform a plurality of unit processes on the substrate W. In certain embodiments, the semiconductor fabrication system 10 may include a plurality of process modules, which are connected to have a cluster structure, and each of which is configured to perform a specific one of the unit processes.

In some embodiments, the deposition system 20 and the etching system 40 may be configured to perform a plasma-based process on the substrate W. For example, the deposition system 20 may include a sputtering apparatus. The etching system 40 may include an inductively-coupled plasma (ICP) etching system.

Hereinafter, the etching system 40 will be described in more detail. The etching system 40 may be a plasma treatment system including the deposition system 20.

Figure 2:
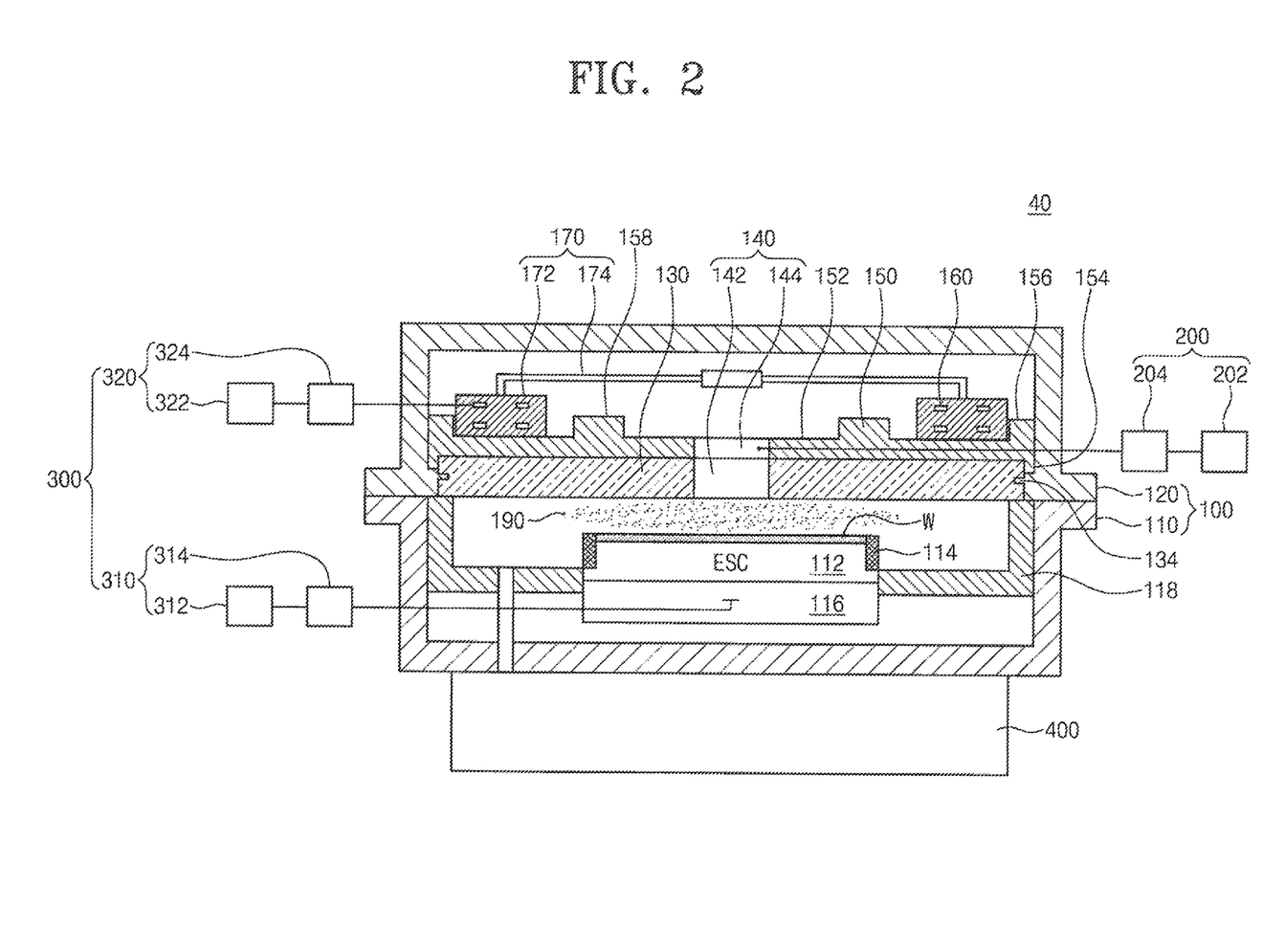
FIG. 2 is a sectional view illustrating an example of the etching system of FIG. 1.

FIG. 2 is a sectional view illustrating an example of the etching system 40 of FIG. 1.

Referring to FIG. 2, the etching system 40 may include a chamber 100, a reaction gas supplying unit 200, a high- or radio-frequency (RF) power supplying unit 300, and a pumping unit 400. The substrate W may be provided in the chamber 100. The reaction gas supplying unit 200 may be configured to supply a reaction gas into the chamber 100. The RF power supplying unit 300 may be configured to provide a high frequency (e.g., RF) power to the chamber 100. The RF power may be used to induce a plasma reaction 190 of the reaction gas. The pumping unit 400 may be configured to pump out the air from the chamber 100. The plasma reaction 190 of the reaction gas may be controlled to allow the substrate W to be etched at a uniform etch rate.

The chamber 100 may be configured to provide a room for isolating the substrate W from the outer space. In some embodiments, the chamber 100 may include a lower housing 110 and an upper housing 120. The lower housing 110 may be disposed below the substrate W. The upper housing 120 may be disposed on the substrate W and the lower housing 110. When the unit process is performed on the substrate disposed on the lower housing 110, the lower and upper housings 110 and 120 may be coupled to each other to hermetically seal the chamber 100. When the unit process is finished, the lower and upper housings 110 and 120 may be vertically separated from each other to load or unload the substrate W on or from the lower housing 110.

The reaction gas supplying unit 200 may be connected to the upper housing 120. The reaction gas supplying unit 200 may include a gas storage unit 202 and a mass flow control valve 204. The gas storage unit 202 may be configured to store the reaction gas. The mass flow control valve 204 may be provided on a conduit connecting the gas storage unit 202 to the upper housing 120. The mass flow control valve 204 may be used to adjust a flow rate of the reaction gas to be supplied into the chamber 100. In some embodiments, the reaction gas may include at least one of strongly acidic gases (e.g., $SF_6$, HF, CF, or $CH_3$).

The RF power supplying unit 300 may be connected to the lower housing 110 and the upper housing 120. The RF power supplying unit 300 may include a first RF power supplying unit 310 and a second RF power supplying unit 320. The first RF power supplying unit 310 may be connected to the lower housing 110. The first RF power supplying unit 310 may include a first RF generator 312 and a first matcher 314. The first RF generator 312 may be configured to generate a first RF power. The first matcher 314 may be disposed between the first RF generator 312 and the lower housing 110. The first matcher 314 may be used for impedance matching of the first RF power. The second RF power supplying unit 320 may be connected to the upper housing 120. The second RF power supplying unit 320 may include a second RF generator 322 and a second matcher 324. The second RF generator 322 may be configured to generate a second RF power. The second matcher 324 may be disposed between the second RF generator 322 and the upper housing 120. The second matcher 324 may be used for impedance matching of the second RF power.

The pumping unit 400 may be connected to the lower housing 110. The pumping unit 400 may be used to exhaust the reaction gas from the space between the lower housing 110 and the upper housing 120, when a process using the reaction gas is finished. For example, the pumping unit 400 may include a vacuum pump. The pumping unit 400 may be configured to reduce an internal pressure of the chamber 100. For example, the pumping unit 400 may be configured to reduce the internal pressure of the chamber 100 to about 1 mTorr to 10 mTorr.

Referring again to FIG. 2, the substrate W may be disposed on an electrostatic chuck 112 of the chamber 100. The electrostatic chuck 112 may be provided in the lower housing 110. The electrostatic chuck 112 may be configured to hold the substrate W with an electrostatic force.

At least one ring member 114 may be disposed on an edge region of the electrostatic chuck 112. The ring member 114 may be provided to enclose an outer sidewall of the substrate W. The reaction gas may be supplied to allow the plasma reaction 190 to occur on the substrate W and the ring members 114.

A lower electrode 116 may be disposed in the lower housing 110 or below the electrostatic chuck 112. The lower electrode 116 may be applied with a first RF power transmitted from the first RF power supplying unit 310. The reaction gas may be concentrated on the substrate W by the first RF power. The first RF power may be used to allow the reaction gas to be moved with a high straightness. The use of the first RF power may make it possible to increase an etching anisotropy in the etching process.

A wall liner 118 may be disposed to enclose the electrostatic chuck 112 and the lower electrode 116. The wall liner 118 may be disposed on an inner wall of the lower housing 110. The wall liner 118 may be formed of or include aluminum. Although not shown, an inner surface of the wall liner 118 may be coated with a ceramic layer for protecting the wall liner 118 against plasma damage.

A window 130, including top and bottom surfaces and a sidewall, may be disposed in the upper housing 120 or on the electrostatic chuck 112. The window 130 may be provided to have at least one clamping region 134 having an inwardly recessed profile. The upper housing 120 may be coupled to the clamping region 134. The window 130 may be fixedly provided in the upper housing 120. The window 130 may be formed of dielectric ceramic materials or include at least one of dielectric ceramic material. For example, the window 130 may include aluminum oxide ($Al_2O_3$) having thermal conductivity of about 9 W/mk.

A gas injection unit 140 may be disposed in the upper housing 120 and on the electrostatic chuck 112 and the substrate W. The gas injection unit 140 may be connected to the reaction gas supplying unit 200. The gas injection unit 140 may be configured to supply a reaction gas on the substrate W. The gas injection unit 140 may include a gas nozzle 142 and a gas feeder line 144. The gas nozzle 142 may be disposed on a center region of the window 130. The gas nozzle 142 may be provided to pass through the window 130 and having an end portion facing a center region of the substrate W. The gas nozzle 142 may spray the reaction gas onto a top surface of the substrate W. The gas feeder line 144 may be dispose to connect the gas nozzle 142 to the mass flow control valve 204. The gas feeder line 144 may be configured to allow the reaction gas to be delivered from the mass flow control valve 204 to the gas nozzle 142.

A cover plate 150 may be disposed in the upper housing 120 and on the window 130. In some embodiments, the cover plate 150 may be disposed to cover the top surface and at least a portion of the sidewall of the window 130. The cover plate 150 may be disposed between the window 130 and antenna electrodes 160. In certain embodiments, the cover plate 150 may include at least one portion disposed between the antenna electrodes 160. The gas feeder line 144 may extend in an outward direction, between the window 130 and the cover plate 150. The cover plate 150 may include a portion that is extended from a region between the window 130 and the antenna electrodes 160 to cover a sidewall of the window 130. In certain embodiments, the cover plate 150 may be extended from the region between the window 130 and the antenna electrodes 160 to an inner wall of the upper housing 120. The cover plate 150 may be aligned with the wall liner 118, when viewed in a plan view. For example, an outside diameter of the cover plate 150 may be substantially the same as that of the wall liner 118.

The antenna electrodes 160 may be disposed in the upper housing 120 and on the cover plate 150. The antenna electrodes 160 may be connected to the second matcher 324. Second RF power may be applied to the antenna electrodes 160. The second RF power may be used to induce the plasma reaction 190 from the reaction gas. The window 130 and the cover plate 150 may isolate the antenna electrodes 160 from the plasma reaction 190. The plasma reaction 190 may be controlled by adjusting an intensity of the second RF power.

An electrode jig 170 may be disposed to fasten the antenna electrodes 160 to the upper housing 120. The electrode jig 170 may include jig blocks 172 and jig lines 174. The jig blocks 172 may be configured to fasten the antenna electrodes 160 to the cover plate 150. The jig lines 174 may connect the jig blocks 172 to each other.

In the case where the cover plate 150 is absent, it may be necessary to perform an aging process to compensate for heat loss of the window 130, after an idle time of the chamber 100. The presence of the window 130 may lead to a large difference in temperature before and after the plasma reaction 190. For example, the window 130 may be rapidly heated by the plasma reaction 190, whereas the window 130 may be rapidly cooled when the plasma reaction 190 is temporarily stopped to perform a loading/unloading operation of the substrate W. Such a rapid change in temperature of the window 130 may make it difficult to heat the chamber 100 to a normal process temperature required for the etching process, and this may lead to failures in a subsequent etching process performed after the idle time. In a conventional etching system, after an idle time of a chamber, an aging process may be performed on the chamber to heat the chamber or a substrate thereon to the normal process temperature for the etching process.

Figure 3:
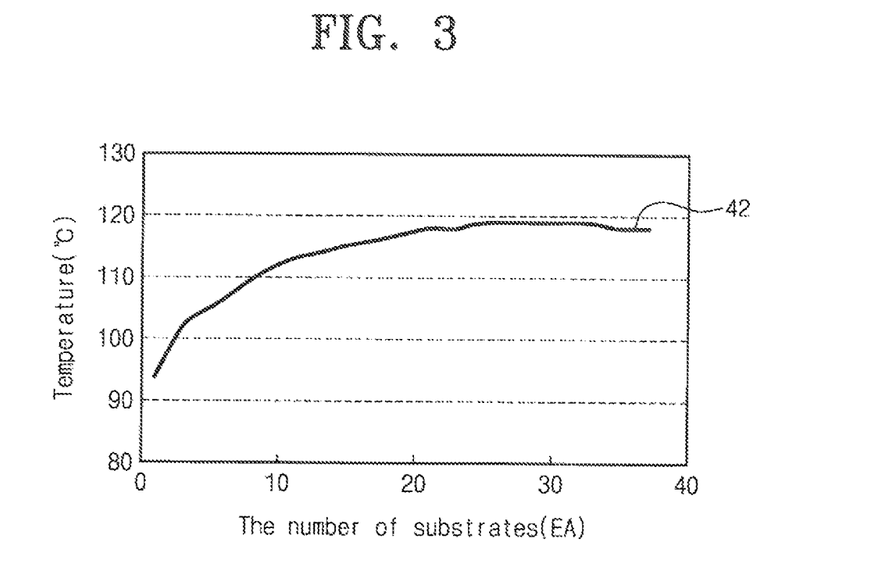
FIG. 3 is a graph illustrating an aging process in a conventional etching system.

FIG. 3 is a graph illustrating an aging process in a conventional etching system.

Referring to FIG. 3, an etching process temperature 42 of a conventional etching system gradually increases after an idle time. For example, the chamber of the conventional etching system may be heated up to a normal process temperature by performing an aging process on about 15-20 wafers after the idle time. In some embodiments, the normal process temperature for the etching process may range from about 115° C. to about 120° C. By contrast, the etching process may be abnormally performed when the substrate is at temperature of about 100-115° C. Accordingly, a bare wafer may be used for the aging process.

Referring back to FIG. 2, the cover plate 150 may prevent or suppress heat energy from being leaked to the outside through the window 130. The cover plate 150 may have thermal conductivity lower than that of the window 130. For example, the cover plate 150 may be formed of or include a plastic material with a thermal conductivity of about 0.8 W/mK or lower. As an example, the cover plate 150 may be formed of or include polyether ether ketone (PEEK).

Figure 4:
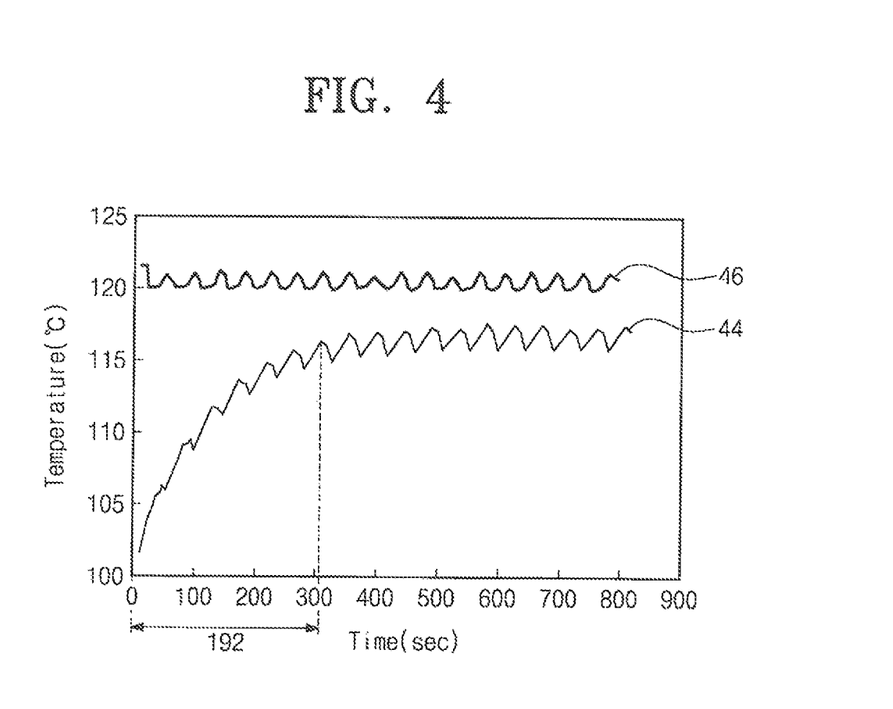
FIG. 4 is a graph illustrating a temporal variation in internal temperature between the proposed etching system of FIG. 2 and the conventional etching system.

FIG. 4 is a graph illustrating a temporal variation in internal temperature between the etching system 40 of FIG. 2 and the conventional etching system.

Referring to FIG. 4 in the case of the conventional etching system, an operation temperature 44 was gradually increased from about 100° C. to about 115° C. during about 300 seconds of a temperature rising section 192, and then, reached to a etching process temperature of about 115° C.

By contrast, according to example embodiments of the inventive concept the etching system 40 was preserved to a substantially constant operation temperature 46 since the idle time of the chamber 100. For example, in the etching system 40 according to example embodiments of the inventive concept, the operation temperature 46 was preserved to about 120° C. This is because the window 130 is thermally insulated by the cover plate 150. The use of the cover plate 150 may make it possible for the etching system 40 to continuously perform the etching process, without a preheating process and/or an aging process of the chamber 100 during the temperature rising section 192. Accordingly, it is possible to improve productivity of the etching process.

Figure 5:
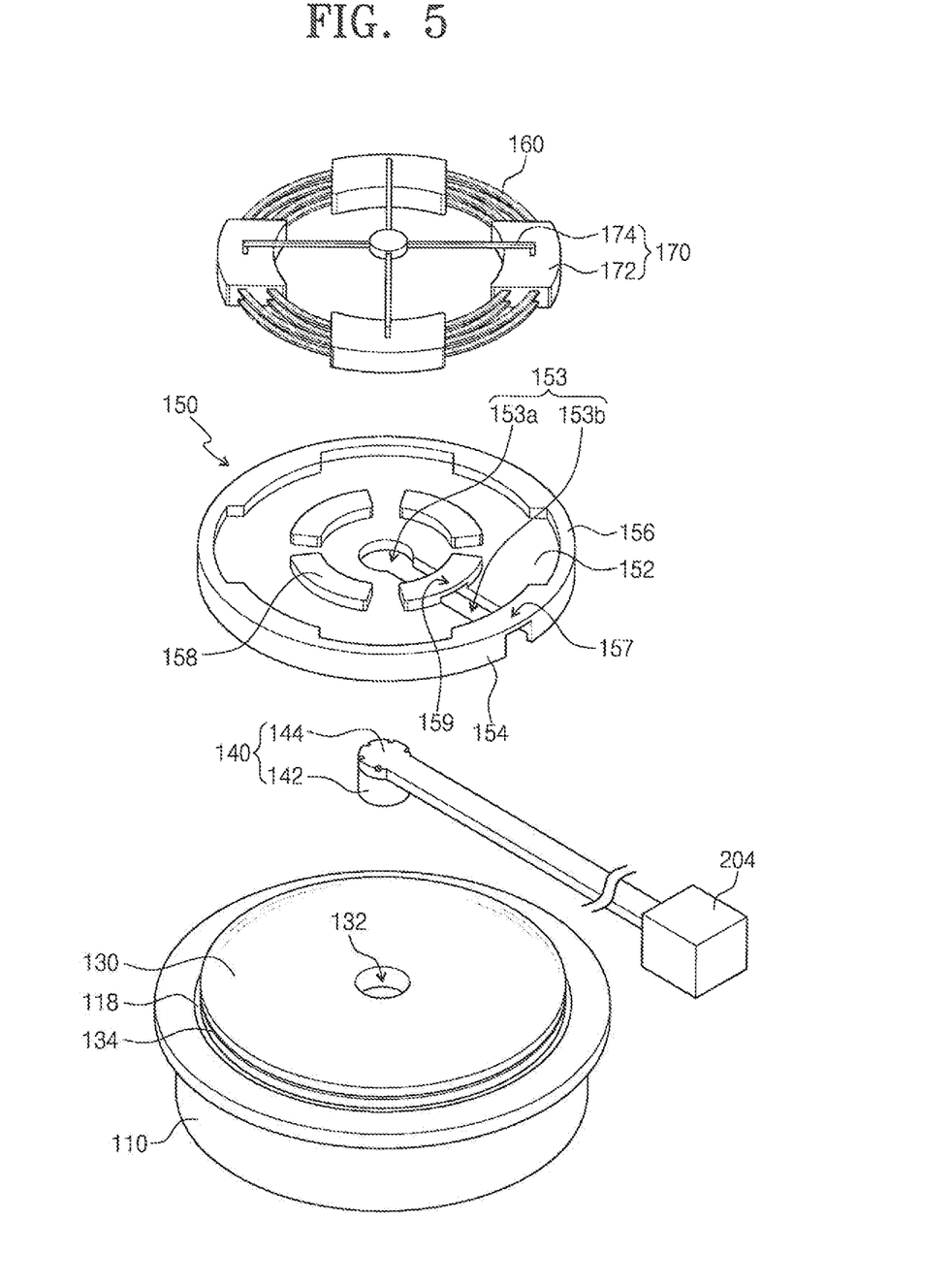
FIGS. 5 and 6 are exploded and assembled perspective views of the window, the gas injection unit, the cover plate, the antenna electrodes, and the jig of FIG. 2.
Figure 6:
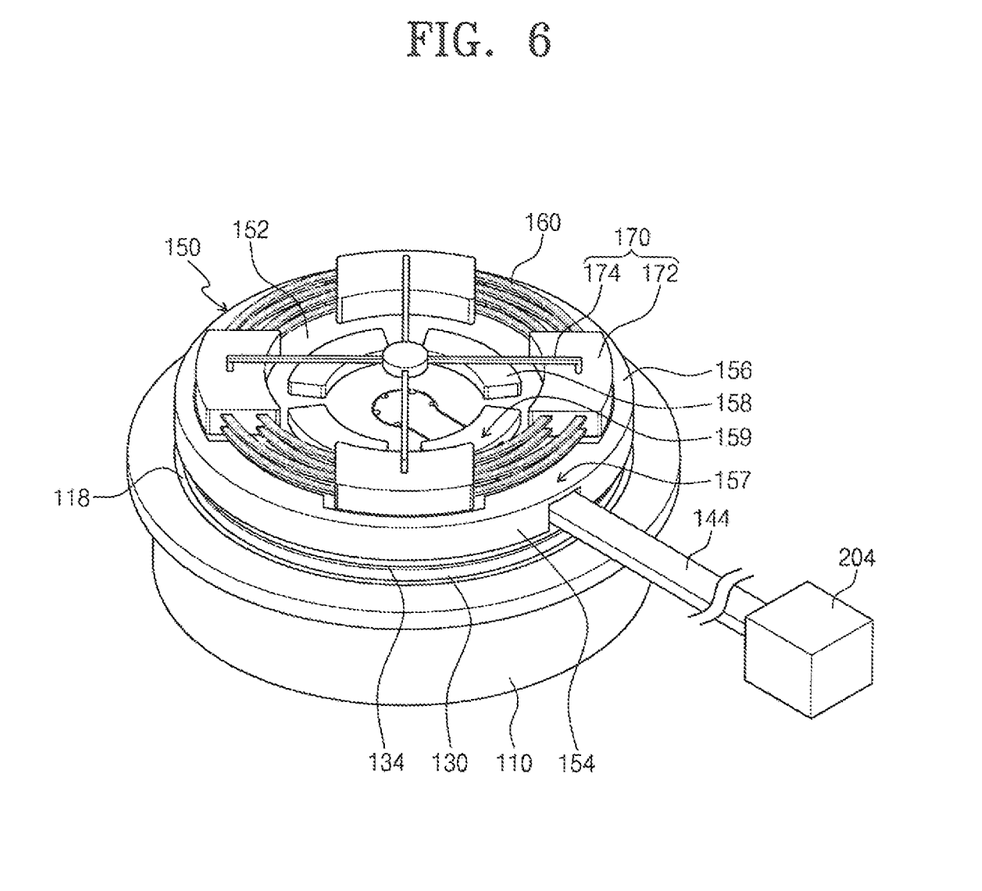

FIGS. 5 and 6 are exploded and assembled perspective views of the window 130, the gas injection unit 140, the cover plate 150, the antenna electrodes 160, and the electrode jig 170 of FIG. 2.

Referring to FIGS. 5 and 6, the cover plate 150 may include a disk portion 2, the disk portion including an upper surface, a lower surface and an edge, a lower edge end portion 154, an upper edge end portion 156, and a plurality of upper block portions 158. The disk portion 152 may be disposed on the window 130. The lower edge end portion 154 may be connected to the edge of the lower surface of the disk portion 152. The upper edge end portion 156 may be connected to the edge of the upper surface of the disk portion 152. Each of the upper block portions 158 may be disposed on the upper surface of the disk portion 152 and within the upper edge end portion 156 and may have an upwardly protruding shape. The upper edge end portion 156 and the upper block portions 158 may have substantially the same height or thickness.

The disk portion 152 may be disposed to cover the top surface of the window 130. The disk portion 152 may be configured to prevent heat energy from being leaked to the outside through the top surface of the window 130. The disk portion 152 may have a diameter larger than that of the window 130. In some embodiments, the disk portion 152 may be aligned to the wall liner 118, when viewed in a plan view. For example, the disk portion 152 may have substantially the same diameter as that of the wall liner 118. The disk portion 152 may have an opening 153. The opening 153 may be provided to expose a portion of the top surface of the window 130. The gas feeder line 144 may be disposed on the top surface of the window 130 to extend from a center region of the window 130 toward the outside region. The gas feeder line 144 may be connected to the mass flow control valve 204 through the opening 153. For example, the opening 153 may include a circular hole 153a and a linear hole 153b. The circular hole 153a may be disposed in a center region of the disk portion 152 (e.g., in the antenna electrodes 160). The circular hole 153a may be aligned with a through hole 132 of the window 130. The gas nozzle 142 may be provided in the through hole 132. The linear hole 153b may extend from the circular hole 153a to an outer peripheral surface of the disk portion 152. The linear hole 153b may have a width smaller than a diameter of the circular hole 153a.

The lower edge end portion 154 may be disposed along the edge of the disk portion 152 to enclose at least a portion of the sidewall of the window 130. For example, the lower edge end portion 154 may enclose the sidewall of the window 130 disposed between the top surface of the window 130 and the clamping region 134. The lower edge end portion 154 may prevent or suppress heat energy from being leaked to the outside through the sidewall of the window 130. The lower edge end portion 154 may be cut by the linear hole 153b and thereby may be shaped like a letter 'C'. In other words, the lower edge end portion 154 may be provided to partially expose the sidewall of the window 130 (e.g., disposed below the gas feeder line 144) to the outside.

The upper edge end portion 156 may be disposed along the edge of the disk portion 152 to enclose the upper block portions 158, the antenna electrodes 160 and the jig blocks 172. In some embodiments, the upper edge end portion 156 may include a first upper bridge 157. The first upper bridge 157 may be disposed on the linear hole 153b. The first upper bridge 157 may be disposed on the gas feeder line 144. The antenna electrodes 160 may include four ring-shaped electrodes. The jig blocks 172 may be disposed along the antenna electrodes 160 and may be spaced apart from each other with substantially the same interval. The gas feeder line 144 may be disposed between the jig blocks 172.

The upper block portions 158 may be surrounded by the antenna electrodes 160 on the upper surface of the disk portion 152. The antenna electrodes 160 and the jig blocks 172 may be disposed on the upper surface of the disk portion 152 between the upper block portions 158 and the upper edge end portion 156. The upper block portions 158 may be disposed on the upper surface of the disk portion 152 and around the circular hole 153a. For example, four upper block portions 158 may be disposed around the circular hole 153a and may be spaced apart from each other with substantially the same interval. In some embodiments, the upper block portions 158 may include a second upper bridge 159. The second upper bridge 159 may be disposed on the linear hole 153b. The second upper bridge 159 may be disposed on the gas feeder line 144. By virtue of the upper block portions 158, it is possible to increase a total thickness of the cover plate 160 and to thermally insulate the window 130 with efficiency.

Figure 7:
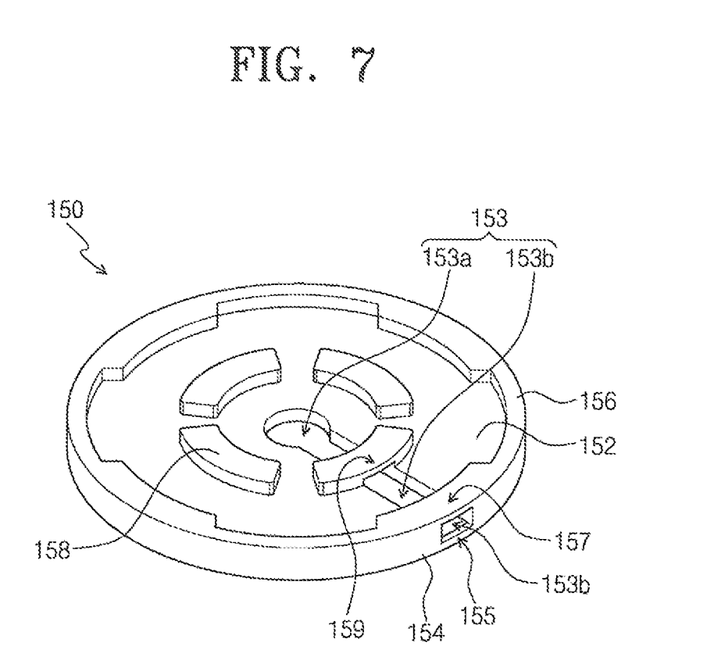
FIG. 7 is a perspective view illustrating an example of the cover plate of FIG. 5.

FIG. 7 is a perspective view illustrating an example of the cover plate 150 of FIG. 5.

Referring to FIG. 7, the lower edge end portion 154 may include a lower bridge 155. The lower bridge 156 may be disposed below the linear hole 153b. The linear hole 153b may be disposed between the lower bridge 155 and the first upper bridge 157.

The disk portion 152, the opening 153, the upper edge end portion 156, and the upper block portions 158 may be configured to have substantially the same features as those of the embodiments described with reference to FIGS. 5 and 6.

Figure 8:
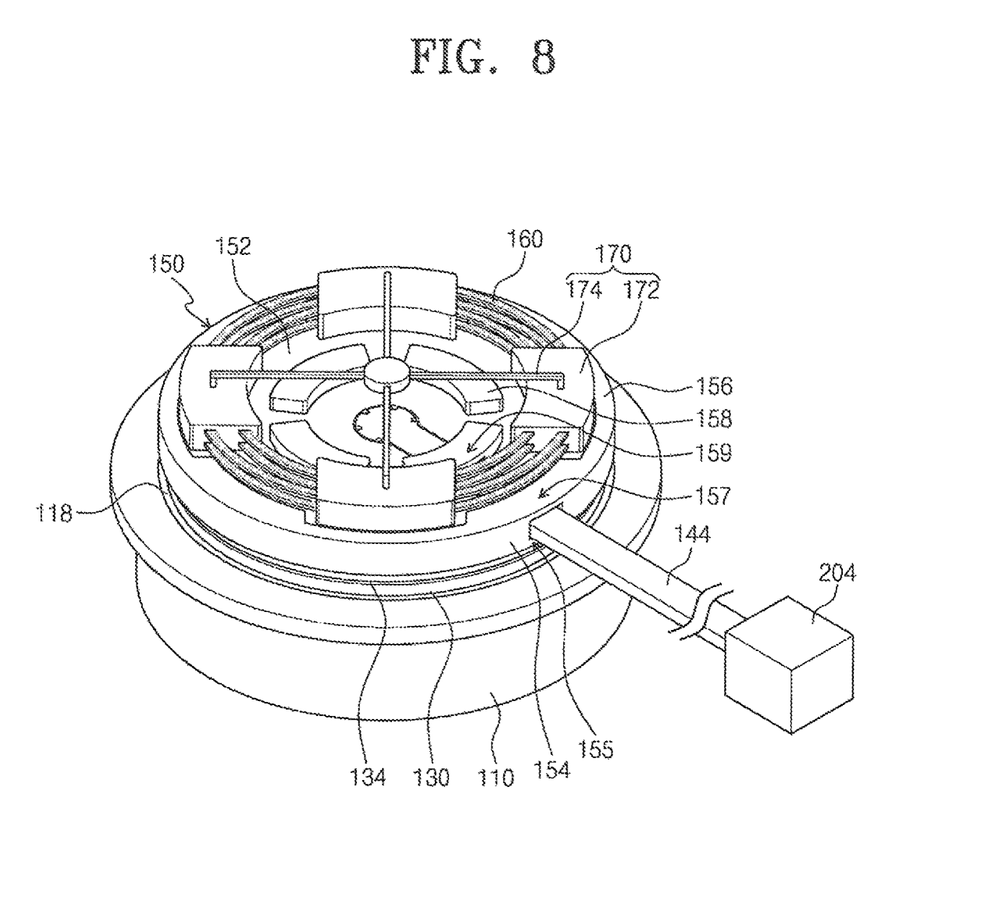
FIG. 8 is a perspective view illustrating a structure, in which the cover plate of FIG. 7 and the gas feeder line of FIG. 5 are assembled.

FIG. 8 is a perspective view illustrating a structure, in which the cover plate 150 of FIG. 7 and the gas feeder line 144 of FIG. 5 are assembled.

Referring back to FIGS. 7 and 8, the gas feeder line 144 may be provided in the linear hole 153b between the lower bridge 155 and the first upper bridge 157. The lower bridge 156 may be provided to partially enclose the sidewall of the window 130 (e.g., disposed below the gas feeder line 144). The lower bridge 155 may prevent or suppress heat energy from being leaked to the outside through the sidewall of the window 130 disposed below the gas feeder line 144.

The lower housing 110, the window 130, mass flow control valve 204, the antenna electrodes 160, and the electrode jig 170 may be configured to have substantially the same features as those of the embodiments described with reference to FIG. 5.

Figure 9:
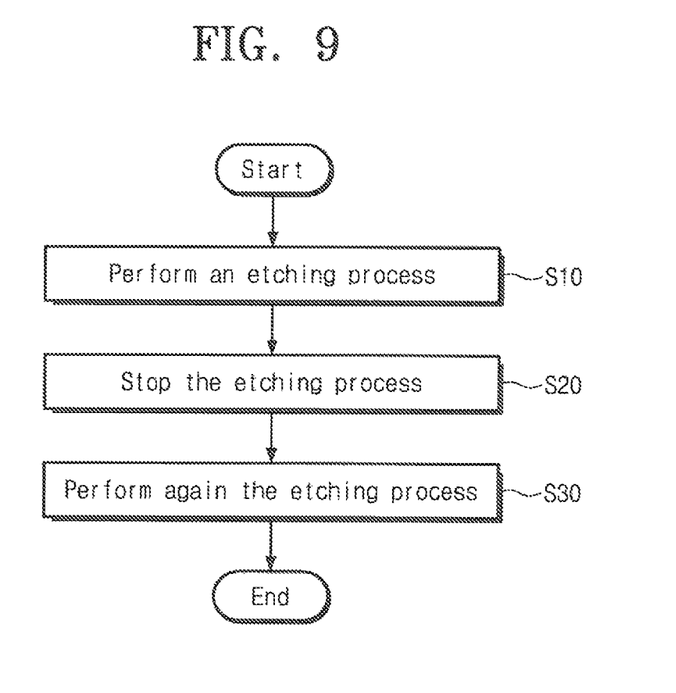
FIG. 9 is a flowchart illustrating an example of an etching method of the etching system of FIG. 2

FIG. 9 is a flowchart illustrating an example of an etching method of the etching system 40 of FIG. 2.

Referring to FIGS. 2, 4 and 9, the etching method may include performing an etching process (in S10), stopping the etching process (in S20), and performing again the etching process (in S30).

The etching process may be performed at a high temperature higher than a room temperature (in S10). The high temperature may be about 115° C. to 120° C.

Next, the etching process may be temporarily stopped while preventive maintenance or dry cleaning of the etching system 40 is performed (in S20). The etching system 40 may be cooled to the room temperature lower than 100° C. Alternatively, the etching process may be suspended while safety checks are carried out.

The etching process may be again performed without aging process (in S30). The etching system 40 is heated to the high temperature.

According to example embodiments of the inventive concept, a plasma treatment system may include a cover plate configured to reduce heat loss in a plasma reaction. The use of such a cover plate may make it possible to allow an etching process in a plasma treatment system to be performed without an aging process.

While example embodiments of the inventive concepts have been particularly shown and described, it will be understood by one of ordinary skill in the art that variations in form and detail may be made therein without departing from the spirit and scope of the attached claims.

What is claimed is:

1. A plasma treatment system, comprising:
a window;
an antenna electrode disposed on the window; and
a cover plate disposed between the antenna electrode and the window, the cover plate extending to a side surface of the window to cover a top surface and at least a portion of the side surface of the window,
wherein the cover plate comprises:
a disk portion disposed on the window to have an opening partially exposing the window;
an upper edge end portion connected to an edge of a top surface of the disk portion to enclose the antenna electrode; and
upper blocks upwardly protruding from the disk portion, the upper blocks disposed between the opening and the antenna electrode and the upper blocks being spaced apart from each other in a substantially equal interval.

2. The plasma treatment system of claim 1, wherein the window comprises a ceramic material, and
the cover plate comprises a plastic material having thermal conductivity lower than that of the ceramic material.

3. The plasma treatment system of claim 2, wherein the cover plate comprises a plastic material with a thermal conductivity of 0.8 W/mK or lower.

4. The plasma treatment system of claim 2, wherein the cover plate comprises polyether ether ketone.

5. The plasma treatment system of claim 1, wherein the cover plate further comprises
a lower edge end portion connected to an edge of a bottom surface of the disk portion to enclose at least a portion of the side surface of the window.

6. The plasma treatment system of claim 5, wherein the opening comprises:
   a circular hole provided at a center region of the disk portion; and
   a linear hole extending from the circular hole to an outer peripheral surface of the disk portion.

7. The plasma treatment system of claim 6, the upper edge end portion comprises a first upper bridge disposed on the linear hole.

8. The plasma treatment system of claim 6, wherein an upper block of the upper blocks comprises a second upper bridge provided on the linear hole.

9. The plasma treatment system of claim 5, further comprising;
   a nozzle provided on a center region of the window; and
   a gas supplying part provided outside the cover plate to supply gas to the nozzle; and
   a gas feeder line provided on the top surface of the window to connect the gas supplying part to the nozzle, the gas feeder line extending from the center region to an edge of the window through the opening.

10. The plasma treatment system of claim 9, wherein the lower edge end portion comprises a lower bridge disposed below the gas feeder line.

11. The plasma treatment system of claim 9, further comprising jig blocks interposed between the antenna electrode and the cover plate to fasten, the antenna electrode,
   wherein the gas feeder line is disposed between the jig blocks.

12. A plasma treatment system, comprising:
   a chamber comprising a lower housing and an upper housing on the lower housing;
   a window disposed in the upper housing;
   an antenna electrode disposed in the upper housing and on the window; and
   a cover plate disposed between the antenna electrode and the window, the cover plate extending to a side surface of the window to cover a top surface and the side surface of the window,
   wherein the cover plate comprises:
      a disk portion disposed on the window to have an opening partially exposing the window;
      an upper edge end portion connected to an edge of a top surface of the disk portion to enclose the antenna electrode; and
      upper blocks upwardly protruding from the disk portion, the upper blocks disposed between the opening and the antenna electrode and the upper blocks being spaced apart from each other in a substantially equal interval.

13. The plasma treatment system of claim 12, wherein the cover plate further comprises
   a lower edge end portion disposed below an edge of the disk portion to enclose a sidewall of the window.

14. The plasma treatment system of claim 13, wherein the window comprises a damping region fastened to the upper housing, and
   the lower edge end portion is disposed on the sidewall of the window disposed between the top surface of the window and the damping region.

15. The plasma treatment system of claim 12, further comprising a wall liner disposed in the lower housing and below the window,
   wherein the cover plate is aligned with the wall liner, when viewed in a plan view.

16. The plasma treatment system of claim 15, wherein the cover plate has an outer diameter same with an outer of the wall liner.

17. A plasma treatment system, comprising:
   a window;
   an antenna electrode disposed on the window; and
   a cover plate comprising a disk portion disposed between the antenna electrode and the window,
   wherein the cover plate further comprises:
      an upper edge end portion connected to an edge of a top surface of the disk portion to enclose the antenna electrode; and
      upper blocks upwardly protruding from the disk portion, the upper blocks disposed between the opening and the antenna electrode and the upper blocks being spaced apart from each other in a substantially equal interval,
   wherein the disk portion comprises:
      a circular hole formed in the: antenna electrode; and
      a linear hole extending: from the circular hole to an outer peripheral surface of the disk portion.

18. The plasma treatment system of claim 17, wherein the cover plate further comprises an upper edge end portion disposed on an edge of the disk portion to enclose the antenna electrode.

19. The plasma treatment system of claim 18, wherein the upper edge end portion comprises a first upper bridge disposed on the linear hole.

* * * * *